United States Patent [19]

Imai

[11] Patent Number: 5,239,565
[45] Date of Patent: Aug. 24, 1993

[54] DRIVING CIRCUIT FOR A CHARGE TRANSFER APPARATUS

[75] Inventor: Shinihi Imai, Yokohama, Japan

[73] Assignee: Kabushiki Kaisha Toshiba, Kanagawa, Japan

[21] Appl. No.: 795,396

[22] Filed: Nov. 21, 1991

[30] Foreign Application Priority Data

Nov. 22, 1990 [JP] Japan .......................... 2-315889

[51] Int. Cl.[5] ........................................ H01L 29/68
[52] U.S. Cl. ........................................ 377/57; 377/58; 377/60; 377/63
[58] Field of Search .................. 377/57, 58, 60, 63

[56] References Cited

U.S. PATENT DOCUMENTS

| | | | |
|---|---|---|---|
| 3,999,171 | 12/1976 | Parsons | 377/58 |
| 4,084,107 | 4/1978 | Ohba et al. | 377/57 |
| 4,648,072 | 3/1987 | Hayes et al. | 377/57 |

*Primary Examiner*—William L. Sikes
*Assistant Examiner*—Scott A. Ouellette
*Attorney, Agent, or Firm*—Finnegan, Henderson, Farabow, Garrett & Dunner

[57] ABSTRACT

In this invention, a plurality of clock buffers are provided to supply clock signals to a charge transfer apparatus. These clock buffers are driven by the same basic clock which is introduced through a plurality of clock logics. Accordingly, even if the charge transfer apparatus is comprised of a multi-stage charge coupled device having a large number of stages, those clock buffers still have enough ability to drive the charge transfer apparatus with high frequency. So, the driving circuit according to this invention can drive a multi-stage charge transfer apparatus with keeping the excellent frequency characteristics, even if the charge transfer apparatus is driven with high frequency.

8 Claims, 3 Drawing Sheets

DRIVING CIRCUIT FOR A CHARGE TRANSFER APPARATUS

BACKGROUND OF THE INVENTION

1. Field of the Invention

This invention relates to a driving circuit for a charge transfer apparatus. More particularly, it relates to a driving circuit in which its high frequency characteristics and the precise delay time can be kept even in the case where the charge transfer apparatus having a multi-stage charge coupled device is driven with high frequency.

2. Description of the Prior Art

FIG. 1 shows a prior art driving circuit for a charge transfer apparatus. As shown in the figure, the driving circuit is comprised of a charge coupled device (CCD) 2, an output signal processing circuit 3, a signal output terminal 4, a clock buffer 5, a clock logic 6, and a clock input terminal 8. In this circuit, said CCD 2, signal processing circuit 3, and signal output terminal 4 compose the charge transfer apparatus.

In the prior art driving circuit shown in FIG. 1, a basic clock (for example, 4 fsc=14.3 MHz ) is input through clock input terminal 8 in order to drive CCD 2. The input clock is then shaped in its wave form by clock logic 6 to generate required timings. This clock is then input to clock buffer 5 in order to drive CCD 2. This CCD 2 has a signal input means and a signal output means, each of which converts electric signals to charge signals and vice versa. Thus, once electric signals are input to CCD 2 through the signal input means, these are converted to charge signals there and transferred to the signal output means where the charge signals are converted to electric signals again. The output signals from CCD 2 are then processed through signal processing circuit 3 and output through output terminal 4.

In usual, a CCD having about 910 stages is required to delay 1H (one horizontal scanning period=63.5 μsec) in the NTSC system with clock frequency 4 fsc=14.3 MHz. On the other hand, about 2270 stages are required to realize a 2H delay in the PAL system with clock frequency 4 fsc=17.7 MHz. For a still longer delay line to realize a broad-band transmission, the required stages of a CCD increase enormously.

Under such a condition, it is necessary to increase the load capacity of clock buffer 5 and, as well, to enlarge the size of clock logic 6. Accordingly, even though the buffer size (for example, channel width for MOS buffers) is enlarged in order to obtain desired frequency characteristics, the buffer becomes saturated in its speed. So, excellent characteristics cannot be obtained from the prior art driving circuit.

As mentioned above, when the prior art driving circuit drives a multi-stage charge transfer apparatus with high frequency so as to keep excellent frequency characteristics, the following disadvantage arises. That is, in that case, the load capacity of the driving circuit for the charge transfer apparatus increases so much that the driving circuit becomes saturated in its speed. As well, the driving ability becomes saturated. As a result, excellent frequency characteristics cannot be realized in the prior art driving circuit.

SUMMARY OF THE INVENTION

This invention has been made to overcome the above mentioned disadvantage of the prior art driving circuit for a charge transfer apparatus.

One objective of this invention is, therefore, to provide a driving circuit for a charge transfer apparatus, the circuit which is able to keep excellent frequency characteristics, even if it drives a multi-stage charge transfer apparatus with high frequency.

Another objective of this invention is to provide a driving circuit for a charge transfer apparatus, the circuit which is able to obtain a high precise delay time, even if it drives a multi-stage charge transfer apparatus with high frequency.

One feature of this invention is to divide a clock buffer which drives a charge transfer apparatus, and a clock logic which drives the clock buffer, into plurality according to the necessity, so as to prevent the buffers and the logics from being saturated.

According to said feature, the driving circuit of this invention is able to keep the excellent frequency characteristics, even if it drives a multi-stage charge transfer apparatus with high frequency.

Another feature of this invention is to drive the first and the last stages of a multi-stage charge transfer apparatus by the outputs from the same clock buffer, in order to exclude variation elements in the clock delay times.

According to said feature, the driving circuit of this invention is able to keep constant the delay time of a charge transfer apparatus, thus providing a driving circuit having a high precise delay time.

These and other objectives, features and advantages of the present invention will be more apparent from the following description of preferred embodiments, taken in conjunction with the accompanying drawings.

DETAILED DESCRIPTION OF THE PREFERRED EMBODIMENTS

Figure 1:
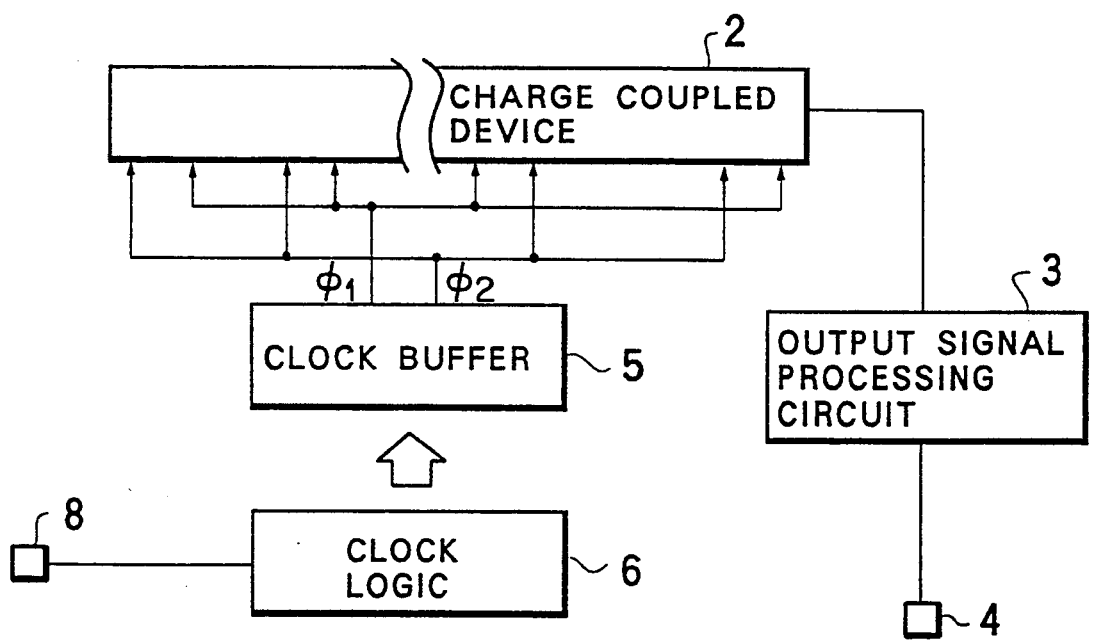
FIG. 1 is a block diagram of the driving circuit for a charge transfer apparatus according to a prior art of this invention.
Figure 2:
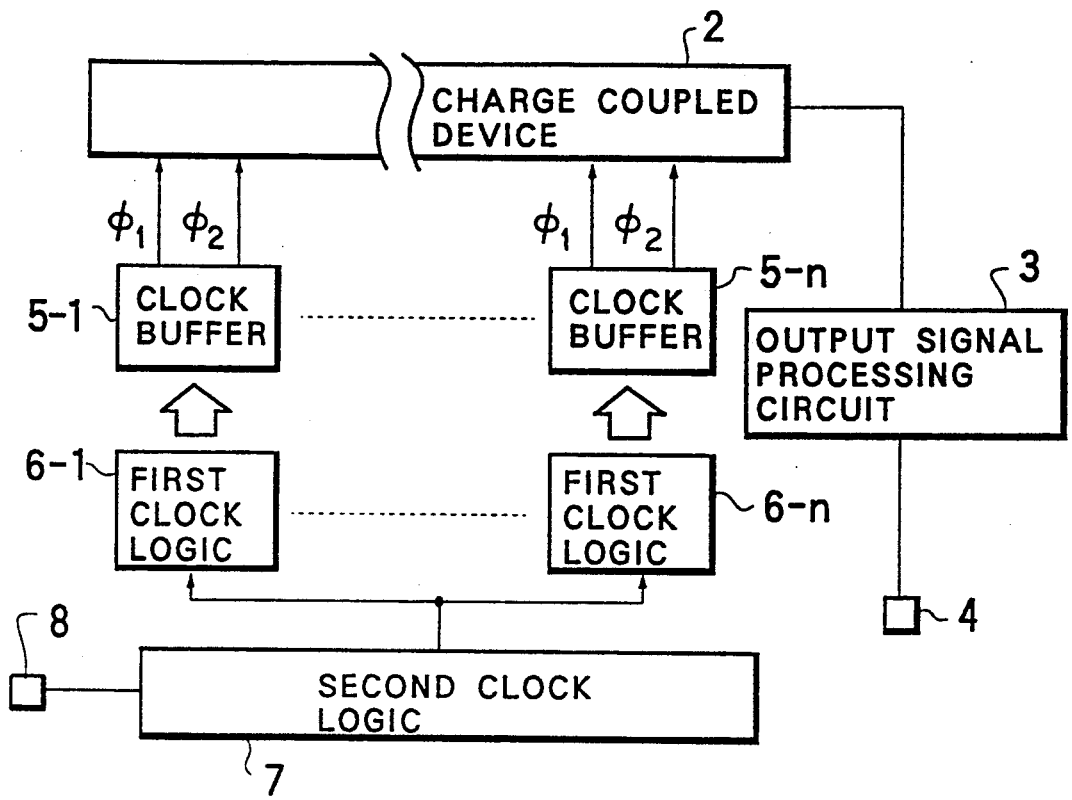
FIG. 2 is a block diagram of the driving circuit for a charge transfer apparatus according to the first embodiment of the present invention.

FIG. 2 is a block diagram of the driving circuit for a charge transfer apparatus, according to the first embodiment of the present invention. In FIG. 2, the same numbers as those shown in FIG. 1 show the same or the like structure members, so that the explanation will be omitted. In this embodiment, as shown in the figure, clock buffer 5 of the prior art shown in FIG. 1 is divided into n clock buffers 5-1, 5-2~5-n, each of which is connected in parallel to charge coupled device (CCD) 2. Clock logic 6 in the prior art is similarly divided into n first clock logics 6-1~6-n and the second clock logic 7.

The n first clock logics are connected in through the clock buffers to the charge coupled device (CCD) 2.

The driving circuit for the charge transfer apparatus according to the present embodiment operates as follows. First, a basic clock to drive CCD 2 is input through clock input terminal 8 to the second clock logic 7. The output from the second clock logic 7 is then introduced into the n first clock logics 6-1~6-n, in order to execute wave form shapings and to generate required timings. The output from these first clock logics are then introduced respectively into n clock buffers 5-1~5-n to produce respective clock, signals under the control of which electric charges are transferred through CCD 2. Input signals are converted into charge signals through the signal input means of CCD 2. The charge signals are converted again into electric signals at the output means of CCD 2 and output to sinal processing circuit 3 where the signals are processed so as to output from output terminal 4.

Figure 3:
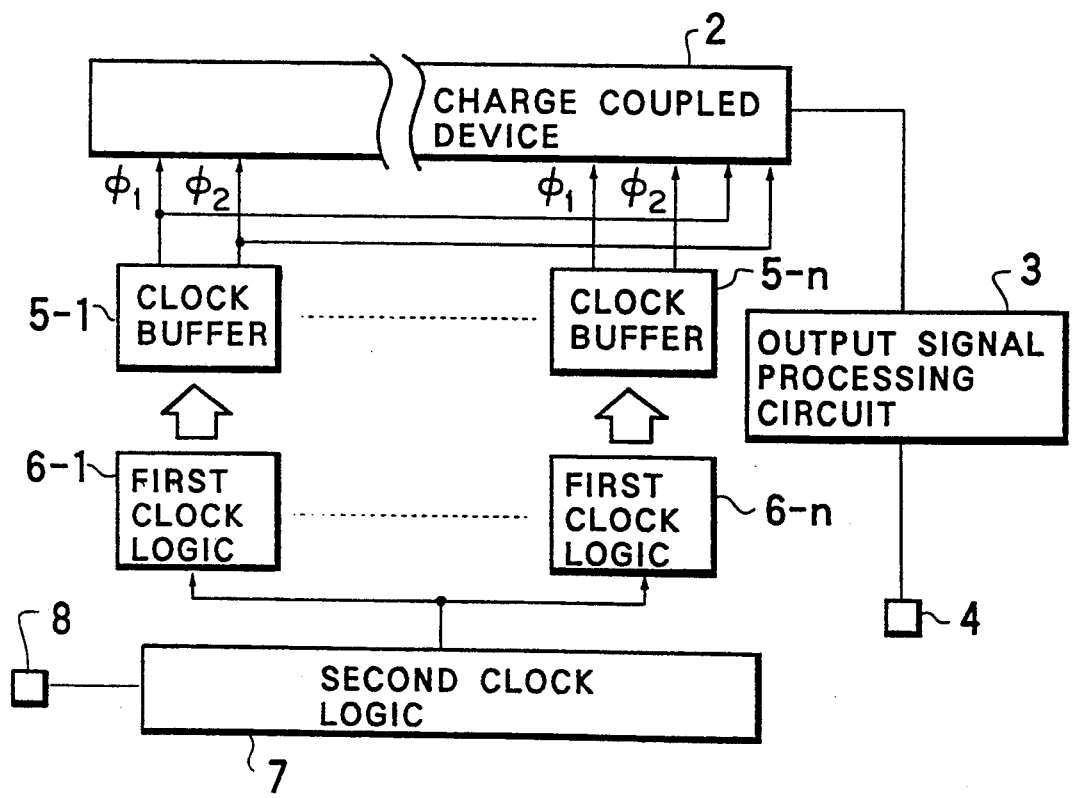
FIG. 3 is a block diagram of the driving circuit for a charge transfer apparatus according to the second embodiment of the present invention.

FIG. 3 is a block diagram of the driving circuit for a charge transfer apparatus according to the second embodiment of the present invention.

Unlike the first embodiment, in the driving circuit for a charge transfer apparatus according to this embodiment, the first stage and the last stage among n stages of CCD 2 are driven by the same clock pulse, that is, the output from the same clock buffer 5-1. According to this embodiment, even if the rise time and/or the fall time of the clock pulses increase, the delay time in CCD 2 can be kept constant.

Figure 4:
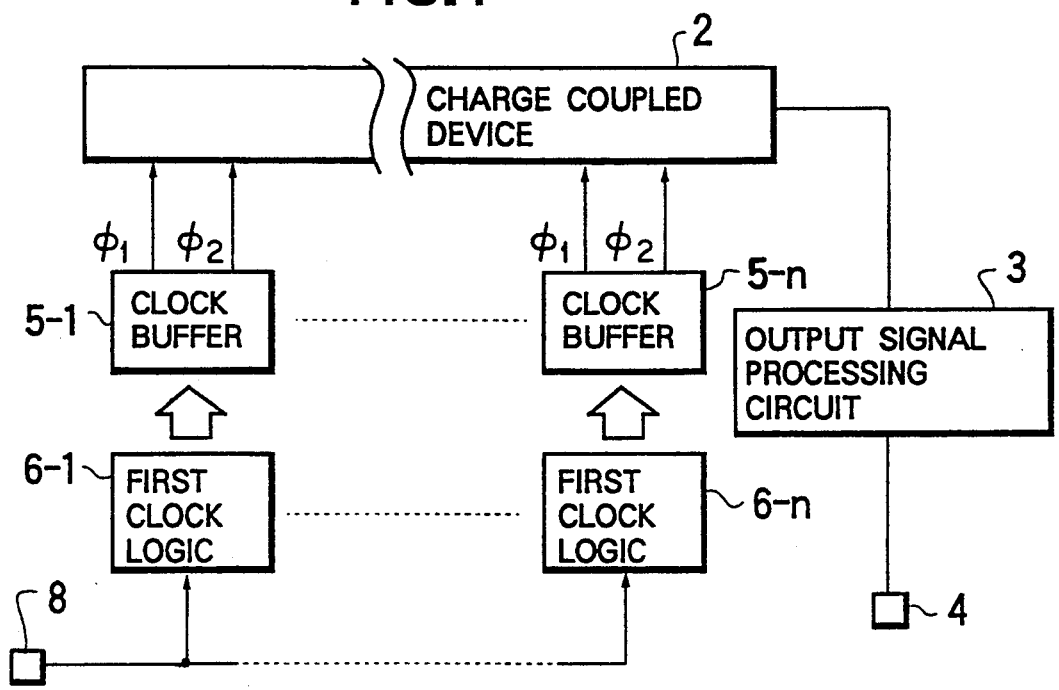
FIG. 4 is a block diagram of the driving circuit for a charge transfer apparatus according to the third embodiment of the present invention.

FIG. 4 is a block diagram of the driving circuit for a charge transfer apparatus according to the third embodiment of the present invention.

Unlike the first embodiment, in the driving circuit of this embodiment, the basic clock to drive CCD 2 is directly input to n first clock logics 6-1~6-n. In this case, n input to n first clock logics 6-1~6-n should have enough ability to drive n clock buffers 5-1~5-n only by them.

Figure 5:
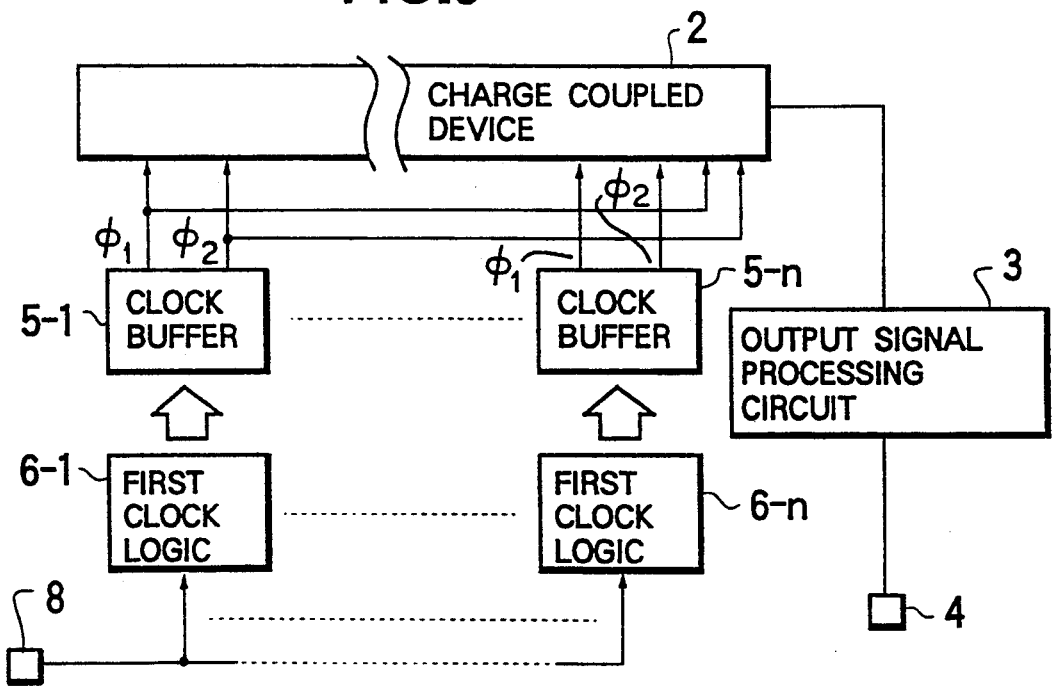
FIG. 5 is a block diagram of the driving circuit for a charge transfer apparatus according to the fourth embodiment of the present invention.

FIG. 5 is a block diagram of the driving circuit for a charge transfer apparatus according to the fourth embodiment of the present invention.

Unlike the second embodiment shown in FIG. 3, in the driving circuit of this embodiment, the basic clock to drive CCD 2 is directly input to n first clock logics 6-1~6-n. In this case, n first clock logics 6-1~6-n should have enough ability to drive n clock buffers 5-1~ 5-n only by them.

In the driving circuit of the present invention, the signal input means provided at the input part of the CCD 2 can be a means to convert electric signals into charge signals as well as a means to convert optical signals into charge signals. Thus, the signal input means should not be limited to only of the two. Also, the charge transfer system in CCD 2 cannot be limited to a single phase system. A double, triple, or quadruple phase system and any other systems can be adopted as the charge transfer system in CCD 2.

In summary, according to the present invention, the clock buffer to drive a charge transfer apparatus is divided into some clock buffers according to the necessity. Also, the clock logic to drive the clock buffer is divided into some according to the numbers of divided buffers. As a result, these buffers do not fall into a saturated situation, even if these are used to drive a multi-stage charge transfer apparatus with high frequency. Therefore, the driving circuit which has excellent frequency characteristics for a charge transfer apparatus can be obtained according to the present invention.

Also, the variation element in clock delay times can be avoided by driving the first and the last stages of a multi-stage charge transfer apparatus with the output from the same clock buffer. The delay time in the charge transfer apparatus can, therefore, be kept constant. So, a driving circuit which is able to realize a high precise delay time for a charge transfer apparatus having a large number of stages can be obtained according to the present invention.

What is claimed is:

1. A driving circuit for a charge transfer apparatus, comprising:
    a predetermined number of clock buffers supplying clock signals to drive said charge transfer apparatus;
    a plurality of first clock logics equal in number to the predetermined number controlling timings of respective clocks and outputting said clock signals respectively into said clock buffers;
    a second clock logic to control timings of respective clocks and outputting clock signals respectively into said first clock logics;
    a clock input terminal to supply basic clock signals into said second clock logic;
    a charge coupled device having a signal input means and a signal output means;
    a signal processing circuit to process output signals from the signal output means in said charge coupled device;
    a signal output terminal to output the processed signals obtained from said signals processing circuit; and
    the signal input means having an optical or electrical charge injection.

2. The driving circuit as claimed in claim 1, wherein said charge coupled device is comprised of a multi-stage charge coupled device having a large number of stages.

3. The driving circuit as claimed in claim 1, wherein said input means included in said charge transfer apparatus converts electric signals into charge signals, or optical signals into charge signals.

4. The driving circuit as claimed in claim 2, wherein a first buffer clock signal is inputted to first and last stages of said multi-stage charge coupled device.

5. A driving circuit for a charge transfer apparatus, comprising:
    a predetermined number of clock buffers supplying clock signals to drive said charge transfer apparatus;
    a plurality of first clock logics equal in number to the predetermined number controlling timings of respective clocks and outputting said clock signals respectively into said clock buffers;
    a clock input terminal to supply basic clock signals into each of the first clock logics;
    a charge coupled device having a signal input means and a signal output means;
    a signal processing circuit to process output signals from the output signal means in said charge coupled device;
    a signal output terminal to output the processed signals obtained from said signal processing circuit; and
    the signal input means having an optical or electrical charge injection.

6. The driving circuit as claimed in claim 5, wherein said charge coupled device is comprised of a multi-stage charge coupled device having a large number of stages.

7. The driving circuit as claimed in claim 5, wherein said input means included in said charge transfer apparatus converts electric signals into charge signals, or optical signals into charge signals.

8. The driving circuit as claimed in claim 6, wherein a first buffer clock signal is inputted to first and last stages of said multi-stage charge coupled device.

* * * * *